United States Patent
Balakrishnan et al.

(10) Patent No.: US 7,486,062 B2
(45) Date of Patent: *Feb. 3, 2009

(54) METHOD AND APPARATUS FOR TRIMMING CURRENT LIMIT AND FREQUENCY TO MAINTAIN A CONSTANT MAXIMUM POWER

(75) Inventors: Balu Balakrishnan, Saratoga, CA (US); Alex B Djenguerian, Saratoga, CA (US); David Michael Hugh Matthews, Sunnyvale, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/020,435

(22) Filed: Jan. 25, 2008

(65) Prior Publication Data
US 2008/0136392 A1 Jun. 12, 2008

Related U.S. Application Data

(63) Continuation of application No. 11/503,448, filed on Aug. 11, 2006, now Pat. No. 7,345,462, which is a continuation of application No. 11/237,254, filed on Sep. 28, 2005, now Pat. No. 7,109,696, which is a continuation of application No. 11/071,380, filed on Mar. 2, 2005, now Pat. No. 6,992,471, which is a continuation of application No. 10/820,667, filed on Apr. 8, 2004, now Pat. No. 6,882,134, which is a continuation of application No. 10/218,763, filed on Aug. 14, 2002, now Pat. No. 6,747,443.

(60) Provisional application No. 60/316,583, filed on Aug. 31, 2001.

(51) Int. Cl.
*G05F 1/40* (2006.01)

(52) U.S. Cl. .................................... 323/284; 361/18
(58) Field of Classification Search ................ 323/282, 323/284, 285, 901; 361/18
See application file for complete search history.

(56) References Cited

U.S. PATENT DOCUMENTS 4,823,070 A    4/1989    Nelson (Continued)

FOREIGN PATENT DOCUMENTS

JP    08-182311    7/1996

(Continued)

OTHER PUBLICATIONS

"Design Idea DI-11 TinySwitch®-II Buck Converter," Power Integrations, Inc., www.powerpoint.com, Aug. 2001.

(Continued)

*Primary Examiner*—Jeffrey L Sterrett
(74) *Attorney, Agent, or Firm*—Blakely Sokoloff Taylor & Zafman LLP

(57) ABSTRACT

A method which regulates a power supply. In one aspect of the invention, the method includes switching a power switch of a power supply regulator at an operating frequency (f) during operation of the power supply regulator. A current through the power switch is controlled to keep the current through the power switch below a peak current limit threshold ($I_p$) during operation of the power supply regulator. The maximum deliverable power value of a power supply to be regulated by the power supply regulator is controlled by trimming of the power supply such that the operating frequency (f) and the peak current limit threshold ($I_p$) are substantially dependent upon each other.

10 Claims, 6 Drawing Sheets

U.S. PATENT DOCUMENTS

| | | | |
|---|---|---|---|
| 4,831,322 A | 5/1989 | Mashino et al. | |
| 5,390,101 A | 2/1995 | Brown | |
| 5,747,976 A | 5/1998 | Wong et al. | |
| 5,831,837 A | 11/1998 | Coyne et al. | |
| 6,011,706 A | 1/2000 | Adragna et al. | |
| 6,147,883 A | 11/2000 | Balakrishnan et al. | |
| 6,154,377 A | 11/2000 | Balakrishnan et al. | |
| 6,226,190 B1 | 5/2001 | Balakrishnan et al. | |
| 6,232,755 B1 | 5/2001 | Zhang | |
| 6,424,229 B1 | 7/2002 | Justice et al. | |
| 6,700,434 B2 | 3/2004 | Fujii et al. | |
| 6,747,443 B2 * | 6/2004 | Balakrishnan et al. | 323/284 |
| 6,781,354 B2 | 8/2004 | Zhang | |
| 6,882,134 B2 * | 4/2005 | Balakrishnan et al. | 323/284 |
| 6,992,471 B2 | 1/2006 | Balakrishnan et al. | |
| 7,109,696 B2 * | 9/2006 | Balakrishnan et al. | 323/284 |
| 7,345,462 B2 * | 3/2008 | Balakrishnan et al. | 323/284 |

FOREIGN PATENT DOCUMENTS

JP     2001-095233     4/2001

OTHER PUBLICATIONS

EP 02 25 6000, European Search Report, Mar. 21, 2003.

* cited by examiner

US 7,486,062 B2

METHOD AND APPARATUS FOR TRIMMING CURRENT LIMIT AND FREQUENCY TO MAINTAIN A CONSTANT MAXIMUM POWER

RELATED APPLICATION

This application is a continuation of U.S. application Ser. No. 11/503,448, filed Aug. 11, 2006 now U.S. Pat. No. 7,345,462, which is a continuation of U.S. application Ser. No. 11/237,254, filed Sep. 28, 2005, now issued as U.S. Pat. No. 7,109,696, which is a continuation of U.S. application Ser. No. 11/071,380, filed Mar. 2, 2005, now issued as U.S. Pat. No. 6,992,471 B2, which is a continuation of U.S. application Ser. No. 10/820,667, filed Apr. 8, 2004, now issued as U.S. Pat. No. 6,882,134 B2, which is a continuation of U.S. application Ser. No. 10/218,763, filed Aug. 14, 2002, now issued as U.S. Pat. No. 6,747,443 B2, which claims the benefit of and claims priority to U.S. provisional application Ser. No. 60/316,583, filed Aug. 31, 2001, entitled "Method and Apparatus For Trimming Current Limit And Frequency To Maintain A Constant Maximum Power."

BACKGROUND OF THE INVENTION

1. Field of the Invention

The present invention relates generally to power supplies and, more specifically, the present invention relates to trimming a power supply for increased accuracy in the maximum deliverable power of the power supply.

2. Background Information

Most battery operated portable electronic products such as cell phones, personal digital assistants (PDAs), etc., require a low power alternating current (AC) to direct current (DC) charger power supply with a constant voltage and constant current (CC/CV) characteristics for charging batteries. In known power supplies the peak current limit threshold and operating frequency are trimmed independently during manufacturing. The two parameters have their own specifications without any relationship to each other. Other known power supplies employ discrete solutions where the tolerances of components like resistors, and capacitors will affect the peak current limit threshold, and the operating frequency, and by doing so also affecting the maximum delivered power.

SUMMARY OF THE INVENTION

Methods and apparatuses for trimming a power supply are disclosed. In one aspect of the invention, a power supply regulator has a peak current limit detection threshold and an operating frequency. In the one embodiment, either the peak current limit threshold or the operating frequency are adjusted specifically to maintain the product of the square of the peak current limit and the operating frequency substantially constant from one power supply controller to another. In one embodiment, the power supply regulator is used to implement a flyback converter. In another embodiment, the power supply regulator is used to implement a buck converter. In one embodiment, the power supply regulator operates with a substantially constant frequency under all operating conditions. In another embodiment, the power supply regulator operates with a substantially constant frequency under a fixed range of operating conditions.

In another aspect of the present invention, a power supply regulator has a peak current limit detection threshold and an operating frequency. The peak current limit threshold and/or the operating frequency are adjusted during the manufacture of the power supply controller to maintain the product of the square of the peak current limit and the operating frequency substantially constant from one power supply regulator to another. In one embodiment, the power supply regulator is used to implement a flyback converter. In another embodiment, the power supply regulator is used to implement a buck converter. In one embodiment, the power supply regulator operates with a substantially constant frequency under all operating conditions. In another embodiment, the power supply regulator operates with a substantially constant frequency under a fixed range of operating conditions.

In yet another aspect of the present invention, a switched mode power supply includes a power supply input and a power supply output. A power supply regulator is coupled to the power supply input and an energy transfer element input. The energy transfer element is further coupled to the power supply output. The power supply regulator has an operating frequency and a threshold to detect the peak energy transfer element input current. In one embodiment, the operating frequency and/or the peak current detection threshold of the power supply regulator are adjusted to maintain the product of the square of the peak current limit and the operating frequency substantially constant from one power supply regulator to another. In one embodiment, the switched mode power supply is a flyback converter. In another embodiment, the switched mode power supply is a buck converter. In one embodiment, the power supply regulator operates with a substantially constant frequency under all operating conditions. In another embodiment, the power supply regulator operates with a substantially constant frequency under a fixed range of operating conditions.

In still another aspect of the present invention, a switched mode power supply includes a power supply input and a power supply output. A power supply regulator is coupled to the power supply input and an energy transfer element input. In one embodiment the power supply regulator has a fixed operating frequency when the switched mode power supply is providing substantially maximum output power. In one embodiment, the power supply regulator has a threshold to detect the peak energy transfer element current. In one embodiment, the operating frequency and/or the peak current detection threshold of the power supply regulator are adjusted during the manufacture of the power supply regulator to maintain the product of the square of the peak current limit and the operating frequency substantially constant from one power supply regulator to another. In one embodiment, the switched mode power supply is a flyback converter. In another embodiment, the switched mode power supply is a buck converter.

Additional features and benefits of the present invention will become apparent from the detailed description and figures set forth below.

BRIEF DESCRIPTION OF THE DRAWINGS

The present invention detailed is illustrated by way of example and not limitation in the accompanying figures.

DETAILED DESCRIPTION

Embodiments of methods and apparatuses for trimming a power supply for increased accuracy in the maximum deliverable power of the power supply are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

In various embodiments, low cost integrated solutions are provided for controlling the maximum deliverable power by trimming of the internally set peak current limit threshold $I_p$, and operating frequency f of a power supply regulator in such a way that the product of the oscillating frequency f and the square of the peak current limit threshold $I_p$ is a constant or substantially uniform from one regulator to the next. Rather than defining an independent operating frequency f, and an independent peak current limit threshold $I_p$, the two are made dependent on each other, and will together determine the maximum deliverable power in an AC to DC or DC to DC power supply.

In one embodiment, the maximum deliverable power in a switch mode power supply that is designed to work in discontinuous operation is determined by the primary inductance of the transformer, operating frequency f, and peak current limit threshold $I_p$. In one embodiment, to keep the maximum deliverable power substantially constant, the operating frequency f and the peak current limit threshold $I_p$ are trimmed in a way such that the product of Equation 1 below:

$$I_p^m \cdot f^n \qquad \text{(Equation 1)}$$

is substantially constant. In one embodiment, m is substantially equal to 2 and n is substantially equal to 1 such that the product of the square of the peak current limit threshold $I_p$ and the operating frequency f is constant. The operating frequency f and the peak current limit threshold $I_p$ can be trimmed during manufacturing. Various embodiments of the present invention can be used to provide a relatively accurate, constant voltage and current characteristic for battery chargers.

Figure 1:
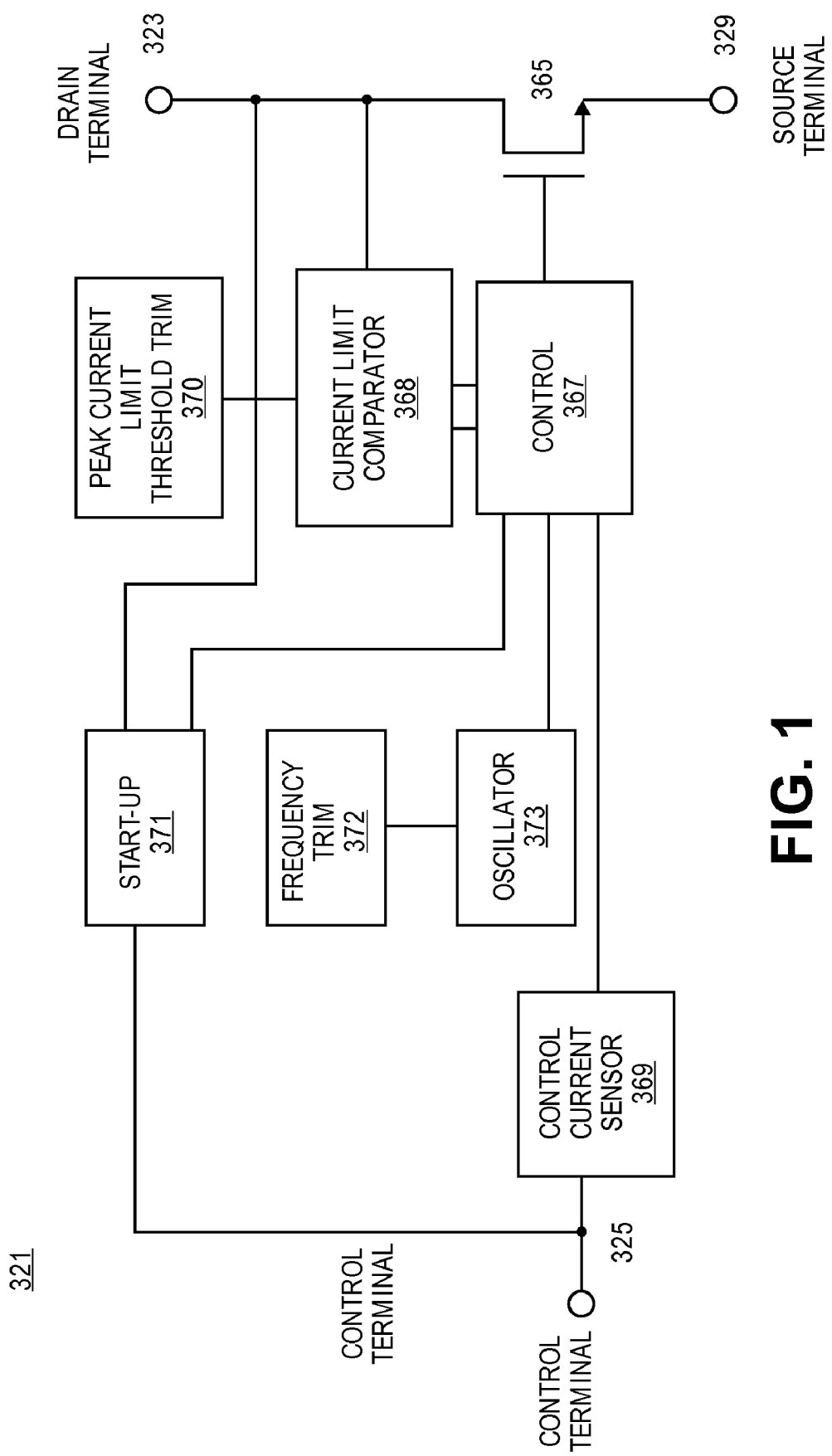
FIG. 1 is a block diagram illustrating one embodiment of a power supply regulator in accordance with the teachings of the present invention.

To illustrate. FIG. 1 is a block diagram illustrating one embodiment of a power supply regulator 321 in accordance with the teachings of the present invention. In one embodiment, the power supply regulator 321 is included on a single monolithic chip having as few as three electrical terminals. The power supply regulator 321 includes a power switch 365 coupled between drain terminal 323 and source terminal 329. In one embodiment, power switch 365 includes a metal oxide semiconductor field effect transistor (MOSFET).

As shown in the embodiment depicted in FIG. 1 the power supply regulator 321 also includes a control current sensor 369 coupled to sense the excess control current through the control terminal 325. The excess control current is the total control terminal current less the supply current of the regulator. The supply current of the regulator is known. Therefore, the total Control terminal current can be deduced from the excess control current. The current received through the control terminal 325 is responsive to a reflected voltage from an energy transfer element of a power supply in FIG. 4 that the power supply regulator 321 is coupled to regulate.

In one embodiment, the power switch 365 is switched in response to the current received through the control terminal 325. A control circuit 367 is coupled to control current sensor 369 and power switch 365. In one embodiment, the control circuit 367 modulates the duty cycle and the peak current limit threshold $I_p$ of the power switch 365 to regulate the output of the power supply in FIG. 4. Accordingly, power switch is switched on and off by control circuitry 367 to enable and disable the delivery of power to the output of the power supply to regulate the power supply output. In so doing, the control circuit 367 modulates the duty cycle of the power switch 365 when the Control terminal current exceeds a control threshold current. In one embodiment, the control circuit 367 reduces the duty cycle when the Control terminal current exceeds the control threshold current. In one embodiment, the control circuit 367 reduces the peak current limit threshold $I_p$ when the Control terminal current is below the same control threshold current.

In one embodiment) the current limit comparator 368 compares the current of the switch 365 to a threshold. When the current of the switch 365 exceeds the threshold of the comparator, the switch is turned off immediately for the remainder of the switching cycle. In one embodiment, the peak current limit threshold trim block 370 sets the peak current limit threshold $I_p$ of the current limit comparator at the control threshold current. The peak current limit threshold $I_p$ is reduced when the Control terminal current goes below the control threshold current. In one embodiment, the power supply regulator 321 also includes a start-up circuit 371 coupled to control terminal 325, drain terminal 323 and control circuit 367. The power supply regulator 321 also includes an oscillator circuit 373, and a frequency trim circuit 372 to program the operating frequency in the oscillator circuit 373. In one embodiment, oscillator 373 is coupled to provide an oscillating signal having the operating frequency f, which is received by control circuit 367 to switch power switch 365. In one embodiment, power switch 365 is switched in response to the oscillating signal received from oscillator 373.

Figure 2:
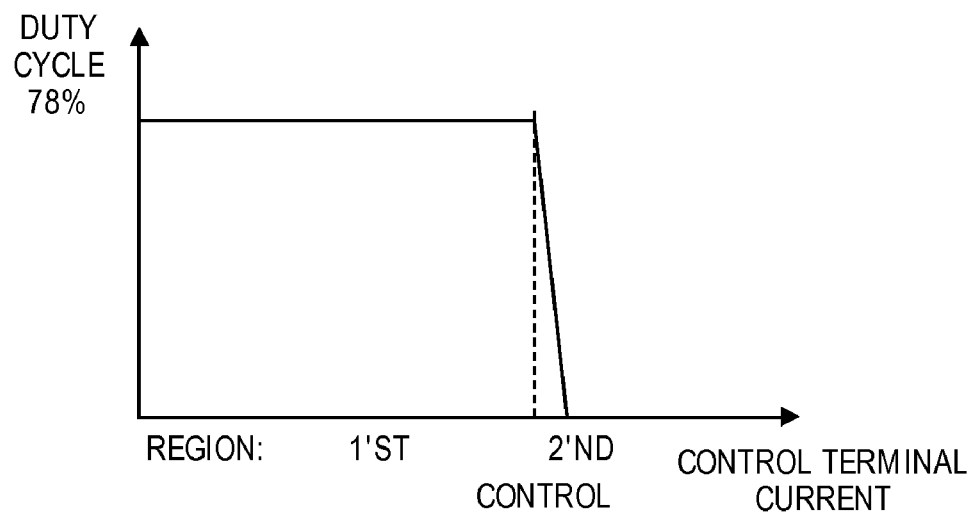
FIG. 2 is a diagram illustrating the relationship between the duty cycle and the current ($I_C$) into the control terminal of one embodiment of a power supply regulator in accordance with the teachings of the present invention.

FIG. 2 shows a diagram illustrating the relationship between the duty cycle and the current ($I_C$) into the control terminal of one embodiment of power supply regulator 321.

The diagram shows two different regions of operation. In the first region, the current ($I_C$) into the control terminal is lower than the Control threshold current and the duty cycle is maximum and the power supply regulator 321 operates in current limit mode. In this mode, the peak current limit threshold $I_p$ is reduced to regulate the current at the output of the power supply. In the second region with increased current ($I_C$) into the control terminal output voltage is controlled by regulating the duty cycle.

Figure 3:
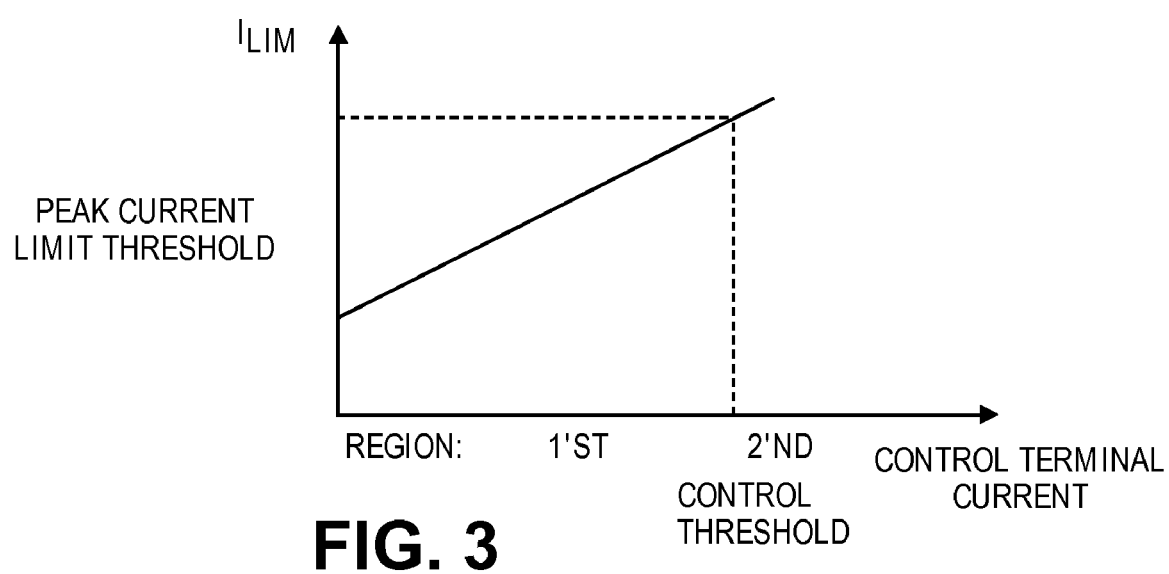
FIG. 3 is a diagram illustrating the relationship between the peak current limit threshold $I_p$ and the current ($I_C$) into the control terminal of another embodiment of a power supply regulator in accordance with the teachings of the present invention.

FIG. 3 shows a diagram illustrating the relationship between the peak current limit threshold $I_p$ and the current ($I_C$) into the control terminal of one embodiment of power supply regulator 321. The peak current limit threshold $I_p$ increases with increased current ($I_C$) into the control terminal of the power supply regulator 321.

Figure 4:
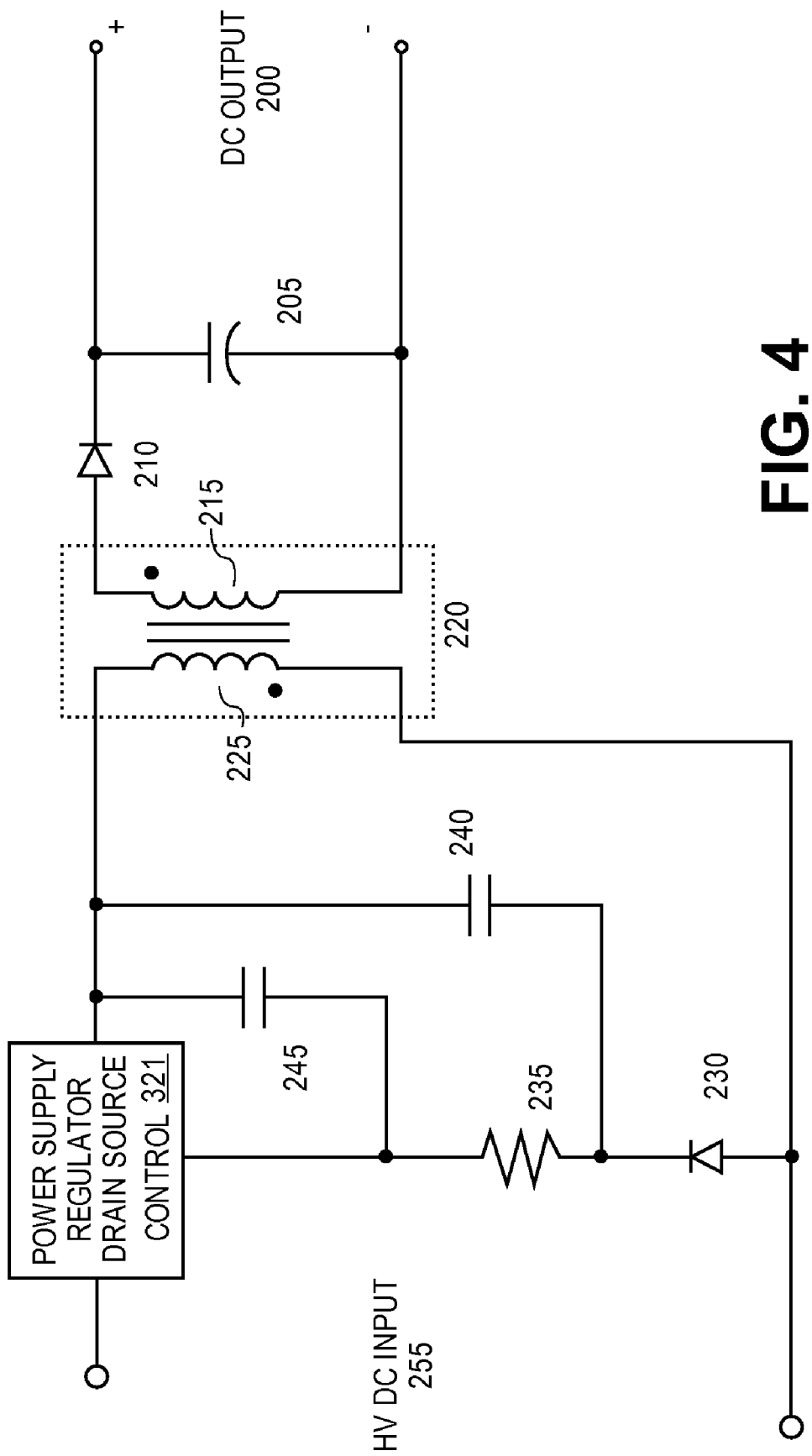
FIG. 4 is a schematic diagram illustrating one embodiment of a power supply that has a relatively constant voltage and current characteristic in accordance with the teachings of the present invention.

FIG. 4 shows one embodiment of a flyback power supply that has a relatively constant voltage and current characteristic. The feedback information is provided to the power supply regulator 321 at its control terminal. The current at the control terminal is proportional to the voltage across resistor 235, which in turn is responsive to the output voltage 200. The power supply regulator 321 reduces the duty cycle of the integrated power metal oxide semiconductor field effect transistor (MOSFET) included in power supply regulator 321 when the voltage across resistor 235 increases above the voltage necessary to establish a Control threshold current. In this section, the output is in constant voltage mode. The power supply regulator 321 reduces the peak current limit threshold $I_p$ of the integrated power MOSFET when the voltage across resistor 235 decreases below the voltage necessary to establish the Control threshold current. The peak current limit threshold $I_p$ is reduced as a function of the voltage across resistor 235 to regulate the output load current.

Figure 5:
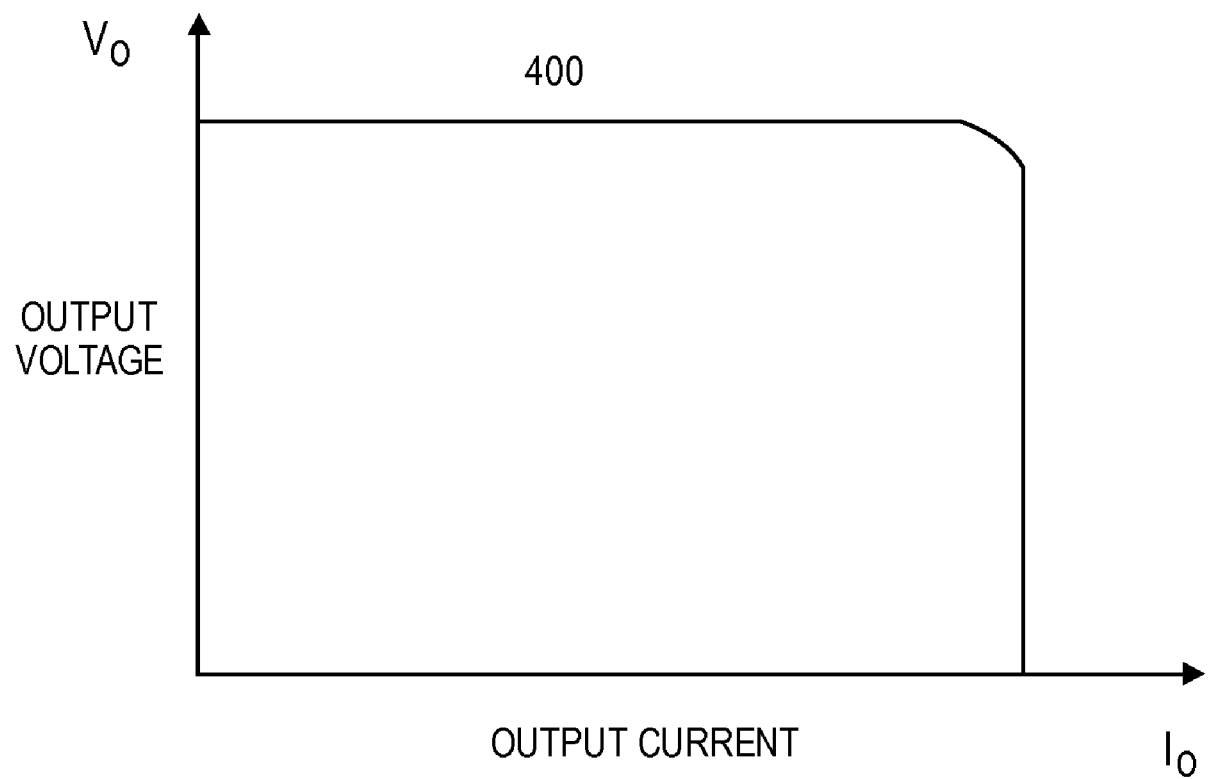
FIG. 5 a diagram illustrating the relationship between the output current and output voltage of one embodiment of a power supply in accordance with the teachings of the present invention.

FIG. 5 is a diagram illustrating the relationship between the output current and output voltage of one embodiment of a power supply in accordance with the teachings of the present invention. As can be seen in curve 400, the power supply exhibits a substantially constant output current and voltage characteristic. That is, as output current increases, the output voltage remains substantially constant until the output current reaches an output current threshold. As the output current approaches the output current threshold, the output voltage decreases as the output current remains substantially constant over the drop in output voltage. It is appreciated that the constant output voltage and constant output current characteristics of the present invention are suitable for battery charger applications or the like.

Figure 6:
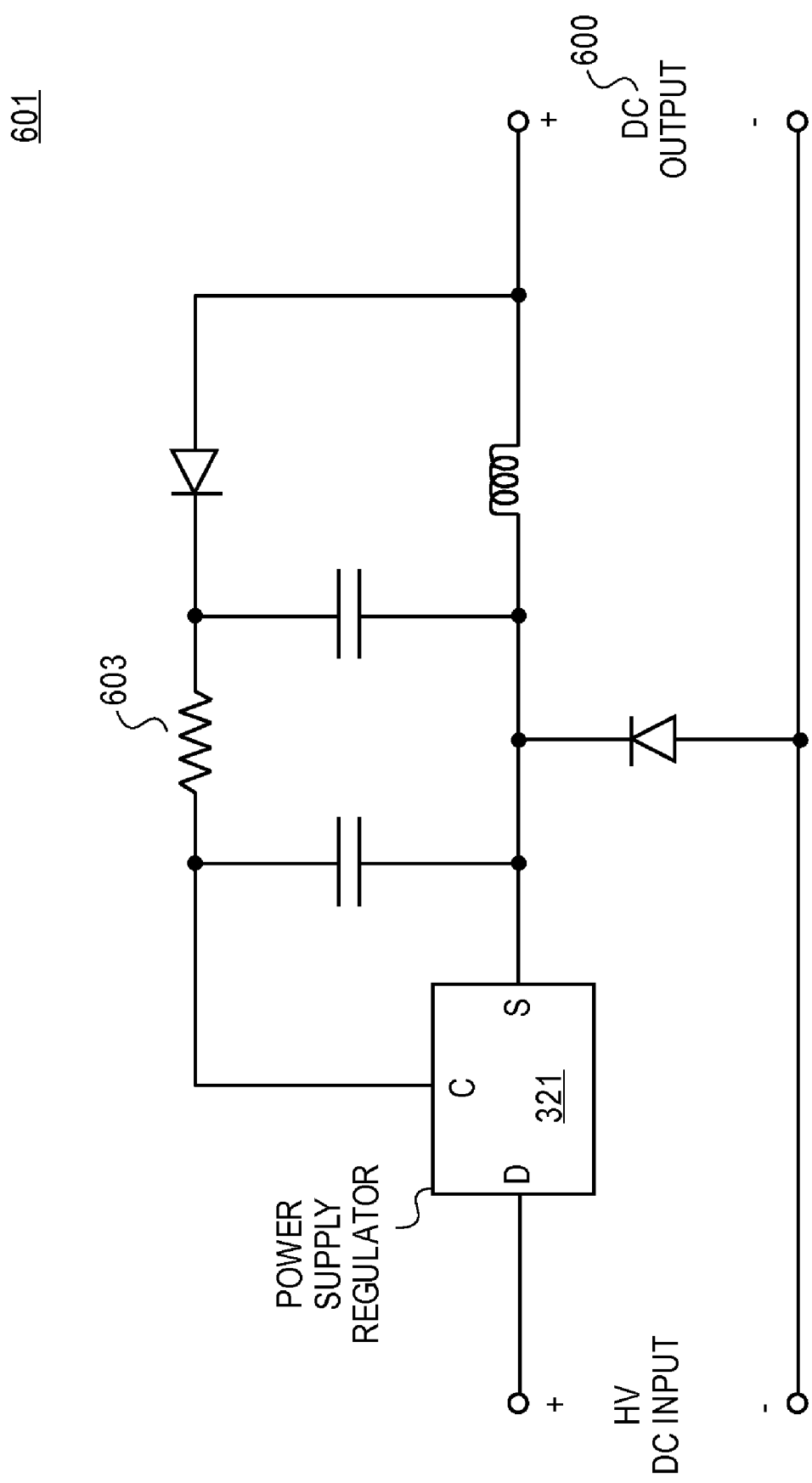
FIG. 6 is a schematic diagram, illustrating another embodiment of a power supply that has a relatively constant voltage and current characteristic in accordance with the teachings of the present invention.

FIG. 6 shows one embodiment of a buck converter power supply 601 that has a relatively constant voltage and current characteristic. The feedback information is provided to the power supply regulator 321 at its control terminal. The current at the control terminal is proportional to the voltage across resistor 603 which in turn is responsive to the DC output 600 voltage. The power supply regulator 321 reduces the duty cycle of the integrated power metal oxide semiconductor field effect transistor (MOSFET) included in power supply regulator 321 when the voltage across resistor 603 increases above the voltage necessary to establish the Control threshold current. In this section, the output is in constant voltage mode. The power supply regulator 321 reduces the peak current limit threshold $I_p$ of the integrated power MOSFET when the voltage across resistor 603 decreases below the voltage necessary to establish the Control threshold current. The peak current limit threshold $I_p$ is reduced as a function of the voltage across resistor 603 to regulate the output load current.

Figure 7:
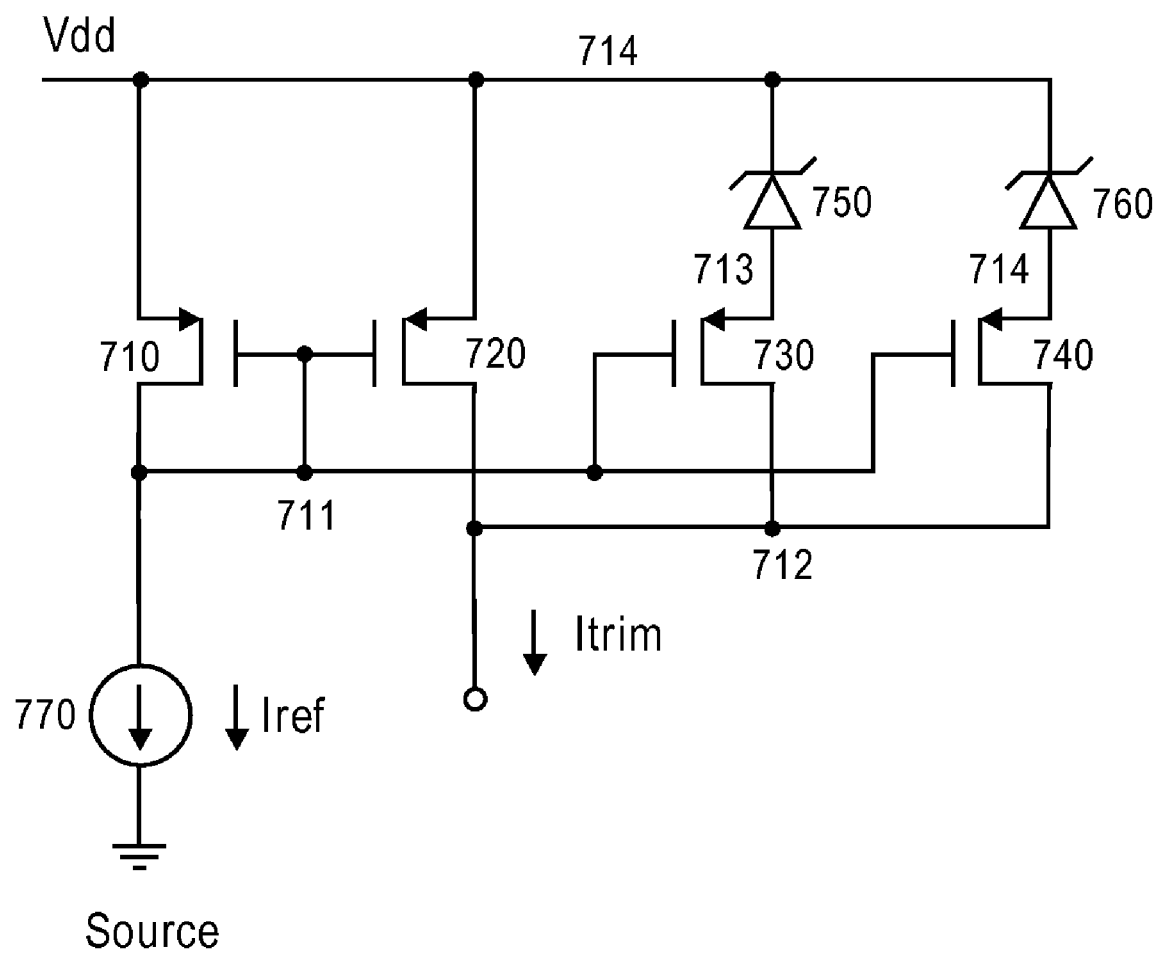
FIG. 7 is schematic of one embodiment of a trim circuit block used for frequency trim or peak current limit threshold trim in accordance with the teachings of the present invention.

FIG. 7 is a schematic of one embodiment of a trim circuit block used for frequency trim or peak current limit threshold $I_p$ trim in accordance with the teachings of the present invention. In this circuit, $I_{ref}$ is a reference current source, and $I_{trim}$ is the trimmed current source. $I_{trim}$ is a current mirror of $I_{ref}$. The ratio of the current mirror changes as more zeners are trimmed. For example when zener 750 is not trimmed, transistor 730 will be practically open since the voltage drop of the zener will inhibit any conduction through the transistor. When zener 750 is trimmed (shorted), transistor 730 will conduct and be in parallel to transistor 720, thereby changing the ratio of the current mirror.

For the oscillator frequency block, $I_{trim}$ can be used to charge and discharge a capacitor. For the current limit comparator, $I_{trim}$ can be used to set the threshold of the comparator. In one embodiment, the peak current limit threshold $I_p$ can be trimmed first. Then the target frequency or operating frequency f can be adjusted by the measured current limit so that the product of the peak current limit threshold $I_p$ squared and operating frequency f will remain constant. This method will provide a constant deliverable power to the output load of the power supply.

In yet another embodiment, the operating frequency f can be adjusted based on the peak current limit threshold $I_p$ and control threshold current so that the product of $I_p^m \cdot f^n$ divided by the control threshold current is constant. Since the control threshold current tracks the output voltage of the power supply, this method essentially compensates the deliverable power for the output voltage, resulting in constant power supply output current at the maximum output power point on the power supply output characteristic.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method, comprising:
   switching a power switch of a power supply regulator at an operating frequency (f) during operation of the power supply regulator; and
   controlling a current through the power switch to keep the current through the power switch below a peak current limit threshold ($I_p$) during operation of the power supply regulator, wherein a maximum deliverable power value of a power supply to be regulated by the power supply regulator is controlled by trimming of the power supply such that the operating frequency (f) and the peak current limit threshold ($I_p$) are substantially dependent upon each other.

2. The method of claim 1 wherein the maximum deliverable power value of the power supply is substantially constant with a maximum deliverable power value of another power supply.

3. The method of claim 1 wherein the trimming of the power supply includes trimming at least one of the operating frequency (f) and the peak current limit threshold($I_p$) during manufacture of the power supply such that a product $I_p^m \cdot f^n$ is substantially constant.

4. The method of claim 3 wherein m is substantially equal to 2 and n is substantially equal to 1.

5. The method of claim 1 wherein the trimming of the power supply comprises trimming a frequency trim circuit coupled to an oscillator and trimming a peak current limit threshold trim circuit coupled to a current limit circuit.

6. The method of claim 5 wherein the operating frequency (f) is an operating frequency of the oscillator that is determined in response to the frequency trim circuit and the peak current limit threshold ($I_p$) is determined in response to the peak current limit threshold trim circuit.

7. The method of claim 1 wherein the operating frequency (f) is substantially constant during operation under substantially all operating conditions of the power supply regulator.

8. The method of claim 1 wherein the operating frequency (f) is substantially constant during operation under a fixed range of operating conditions of the power supply regulator.

9. The method of claim 1 wherein the power supply is a flyback converter power supply.

10. The method of claim 1 wherein the power supply is buck converter power supply.

* * * * *